US012607816B1

(12) United States Patent
Yuen et al.

(10) Patent No.: US 12,607,816 B1
(45) Date of Patent: *Apr. 21, 2026

(54) ELECTRICAL TO OPTICAL CONVERTER MODULE WITH DEDICATED HIGH SPEED SUBSTRATE

(71) Applicants: Albert T Yuen, Palo Alto, CA (US); Paul K Rosenberg, Santa Cruz, CA (US)

(72) Inventors: Albert T Yuen, Palo Alto, CA (US); Paul K Rosenberg, Santa Cruz, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/290,351

(22) Filed: Aug. 5, 2025

Related U.S. Application Data

(63) Continuation of application No. 19/209,651, filed on May 15, 2025, now Pat. No. 12,429,659.

(60) Provisional application No. 63/795,179, filed on Apr. 25, 2025.

(51) Int. Cl.
*G02B 6/42* (2006.01)
*H05K 1/18* (2006.01)

(52) U.S. Cl.
CPC ........... *G02B 6/4278* (2013.01); *G02B 6/428* (2013.01); *H05K 1/18* (2013.01); *H05K 2201/10325* (2013.01)

(58) Field of Classification Search
CPC ........ G02B 6/4278; G02B 6/428; H05K 1/18; H05K 2201/10325
USPC ........................................................ 361/760
See application file for complete search history.

(56) References Cited

U.S. PATENT DOCUMENTS

| | | | | |
|---|---|---|---|---|
| 2014/0159506 A1* | 6/2014 | Kim | .................... | H02M 3/1584 307/131 |
| 2015/0050022 A1* | 2/2015 | Loredo, Jr. | ......... | H04L 12/6418 398/67 |

* cited by examiner

*Primary Examiner* — Andargie M Aychillhum
(74) *Attorney, Agent, or Firm* — Shalini Venkatesh

(57) ABSTRACT

An electrical to optical converter module has one or more fiber pigtailed or fiber connectorized electrical to optical converters; and a module high speed substrate comprising materials enabling signals at data rates at or above 100 Gb/s to be carried. The module high speed substrate delivers to the electrical to optical converters, for conversion to optical signals, electrical signals received from an output end of a copper cable via an electrical socket connected to the module high speed substrate. An input end of the copper cable is connected to a CPC socket mounted on a source high speed substrate, separate and distinct from the module high speed substrate. The module high speed substrate is connected to a DC socket module mounted on a PCB.

9 Claims, 9 Drawing Sheets

Figure 1 – Prior Art

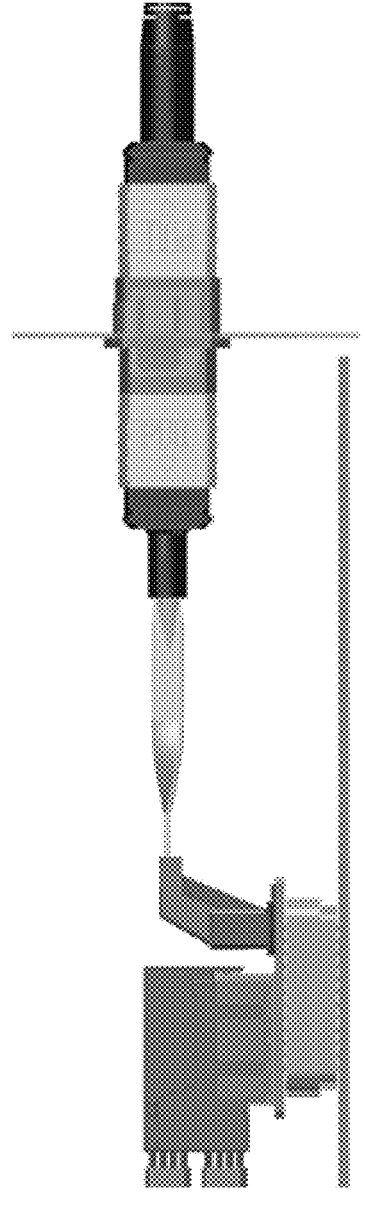
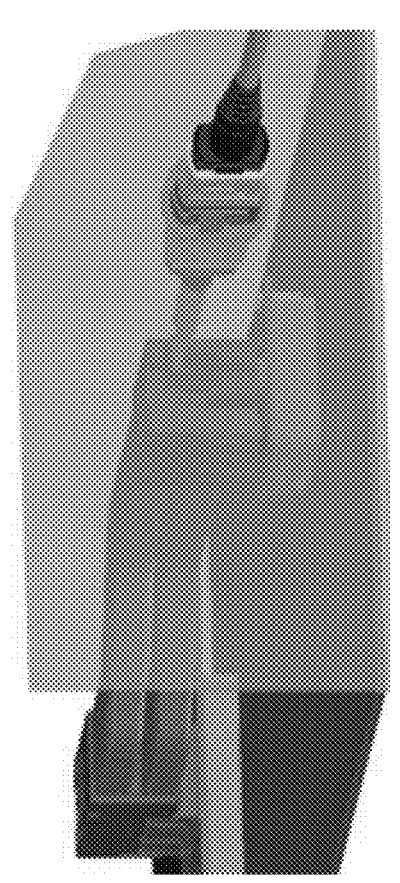
Figure 9

ELECTRICAL TO OPTICAL CONVERTER MODULE WITH DEDICATED HIGH SPEED SUBSTRATE

CROSS-REFERENCES TO RELATED APPLICATIONS

This application claims priority from U.S. patent application Ser. No. 19/209,651, entitled "Electrical to Optical Converter Module", filed on May 15, 2025, which claims priority from U.S. Provisional Patent Application Ser. No. 63/795,179, entitled "Electrical to Optical Converter Module", filed on Apr. 25, 2025. The entire disclosures of the above applications are hereby incorporated by reference as if set forth in full in this application for all purposes

FIELD OF INVENTION

This invention relates to the general field of fiber-optic communications components, and in particular to components needed to provide high quality signal transmission for high data rate signals.

BACKGROUND

High quality chip-to-chip transmission of high data rate signals is needed in many applications, such as transmission between GPUs, or between a switch ASIC and a GPU, for example. Two established approaches to achieve this prior to the present invention are illustrated in FIG. 1 (Prior Art). In both illustrative cases, the signal source is an ASIC chip 105 mounted on a substrate 115 that is designed to carry high date rates with minimal degradation of signal quality—hereafter termed a "high speed" or "fast" substrate. The final target, not shown in this Figure, is typically on a nearby line card but may in some cases be on the same line card 120.

It should be noted that FR4, the dielectric material most commonly used in PCBs, is characterized by signal loss values in the range 1.0 to 2.0 dB/inch when carrying signals at a data rate of 100 Gb/s, with losses increasing above 2 dB/inch as signal rates rise above 100 Gb/s. In contrast, signal loss values can be as low or lower than 0.5 dB/s for 100 GB/s signal rates in substrates termed "high speed" or "fast" in this disclosure.

Returning to FIG. 1 (Priori Art), the source ASIC chip is connected through high speed substrate 115 and then through a co-packaged copper (CPC) socket 110 (i.e. a socket mounted on that same substrate) to a copper cable 125. Data signals from the ASIC chip do not enter the PCB underlying the high speed substrate, so signal integrity is not compromised at this first stage of transmission.

In example 100, the CPC socket 110 sends the received signals through copper cable 125 to a port on bulkhead 150 from where they continue on until they reach the (unseen) target chip, either on the same cable 125 or another cable (unshown) to which 125 connects. At data rates of about 200 Gb/s, good signal quality may only be maintained over a distance (spanned by the copper cable(s)) of up to about 1 m. This forces a practical upper limit on the chip to chip distance that may be accommodated using this type of simple copper cable connection. There are some weight sensitive applications (within aircraft or satellites for example) where even the weight of 1 m of copper cable would be undesirable, so the limit is even lower in those cases.

It should be noted that in some cases, a group of copper wires that is not enclosed in a cable jacket may be used, but the same term "copper cable" may be used in this disclosure to cover both options, for simplicity.

In example 150, the CPC socket 110 sends the signals received from chip 105 into attached copper cable 125 that just takes it a short distance to a second electrical socket 112, of a similar type to socket 110 but in this case being mounted directly on the underlying PCB, and having a port into which a pluggable OSFP, QSFP, or similar module 165 can be inserted, as shown. The signals can therefore travel from this second copper socket 112, through tracks on PCB 120, into pluggable module 165, and then to travel along a cable attached to that module to ultimately reach the target chip (not shown). The effective reach of the cable attached to the pluggable module may be significantly greater in example 150 than the reach of the cable in example 100, due to additional functionality within the pluggable module. Module 165 may, for example, be an optical module of a type using an array of edge emitting lasers, to provide an optical output, that is carried away by an optical fiber cable. This can increase the potential chip to chip distance in the 200 Gb/s case to about 1 km. The drawback of all these pluggable module approaches, though, is that in their slow passage through the PCB, the quality of the data signals is inevitably degraded, as would be apparent even over distances well under 1 km.

Therefore, there is a need for connectivity solutions that can provide high signal quality chip-to-chip data transmission over significantly longer distances than can be achieved with currently available approaches. Ideally such solutions would be based on components that can easily be added into customers current systems, can be used when appropriate, and bypassed or ignored when not needed, without incurring a power or performance penalty.

BRIEF DESCRIPTION OF DRAWINGS

FIG. 9 illustrates an angled lateral view of components that may be used in some embodiments of the present invention.

DETAILED DESCRIPTION

As discussed above, current approaches to chip-to-chip transmission at high data rates are subject to some degree to a "trade-off" or compromise between the distance over which signals can be conveyed and the quality at which those signals can be maintained during the transmission. This is a limiting factor in some applications.

Figure 1:
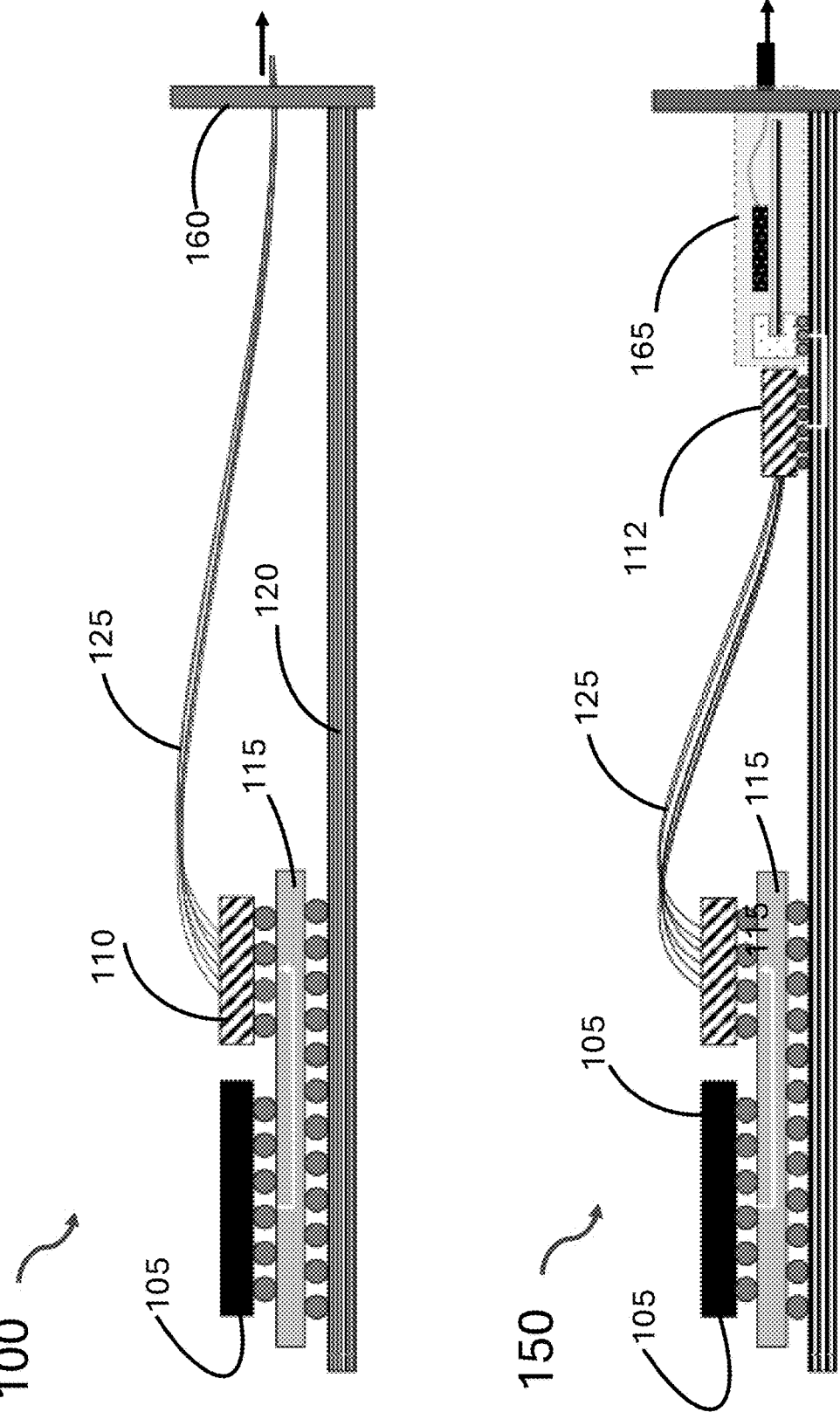
FIG. 1 (Prior Art) illustrates examples of current approaches to provide chip to chip signal transmission.
Figure 2:
FIG. 2 illustrates an electrical-to-optical converter module according to some embodiments of the present invention.

FIG. 2 illustrates one version of a new approach, in which that problem is addressed using an electrical-to-optical converter module designed and operated according to some embodiments of the present invention. As in FIG. 2, in the orientation of components shown, the signals of interest may be considered to move in a generally left to right direction. Starting at ASIC chip 205, the signals reach CPC socket 210 by passing through the high speed substrate 215 on which both chip 205 and socket 210 are mounted. As in the prior art examples shown in FIG. 1, the data signals leaving ASIC chip 205 do not pass along any tracks on PCB 220 before reaching component 210. Ball grid arrays (BGAs) are typically used (as seen in FIGS. 1 and 2) to make the connections between the high speed substrate and the overlying chip (and socket), and between the high speed substate and the underlying PCB, but in some embodiments, other standard chip/socket to board or board to board connectivity options may be used.

From CPC 210, the data signals are carried along a copper cable 225 to reach an electrical socket 235, of a similar type to CPC socket 210, but mounted on an underlying high speed substrate 230, capable, like substrate 215, of carrying high data rate signals with minimal degradation. The signals received by socket 235 enter substrate 230 (via a BGA in this shown embodiment, though in other embodiments, other connection options may be used), travel along tracks on 230, and are then picked up by an array of fiber pigtailed (or fiber connectorized) electrical to optical converters 245. The combination of array 245 and high speed substrate 230 defines an electrical to optical converter module 250 for this embodiment of the present invention. Module 250 is mounted, in the example illustrated, on a DC socket layer 240. Options for this socket layer (or socket module) include a socket with one or more of a set of electrical pins, a land grid array (LGA), and a BGA on an upper surface as shown in the figure.

DC power, grounding and control functionality (using the I2C protocol, for example) is provided at socket layer 240 in between high speed substrate 230 and underlying PCB 220. The fact that the high data rate signals of interest do not encounter either the socket layer or PCB tracks allows for high signal quality to be retained, while the electrical to optical conversion at array 245 allows for fiberoptic transmission from this point on. In combination, these features provide roughly an order of magnitude improvement in distance reachable (chip to chip separation) relative to what is possible with copper cable connections in prior art example 100, and with higher signal integrity than is possible with prior art example 150. For example, in embodiments of the present invention using multimode VCSELs, 200 Gb/s signals would be transmittable over a distance of 10 m rather than 1 without appreciable signal degradation. In embodiments where the arrays use single-mode VCSELs or edge emitters with Silicon photonics technology, an additional 1 or 2 orders of magnitude improvement in reachable distance may be achievable.

Figure 3:
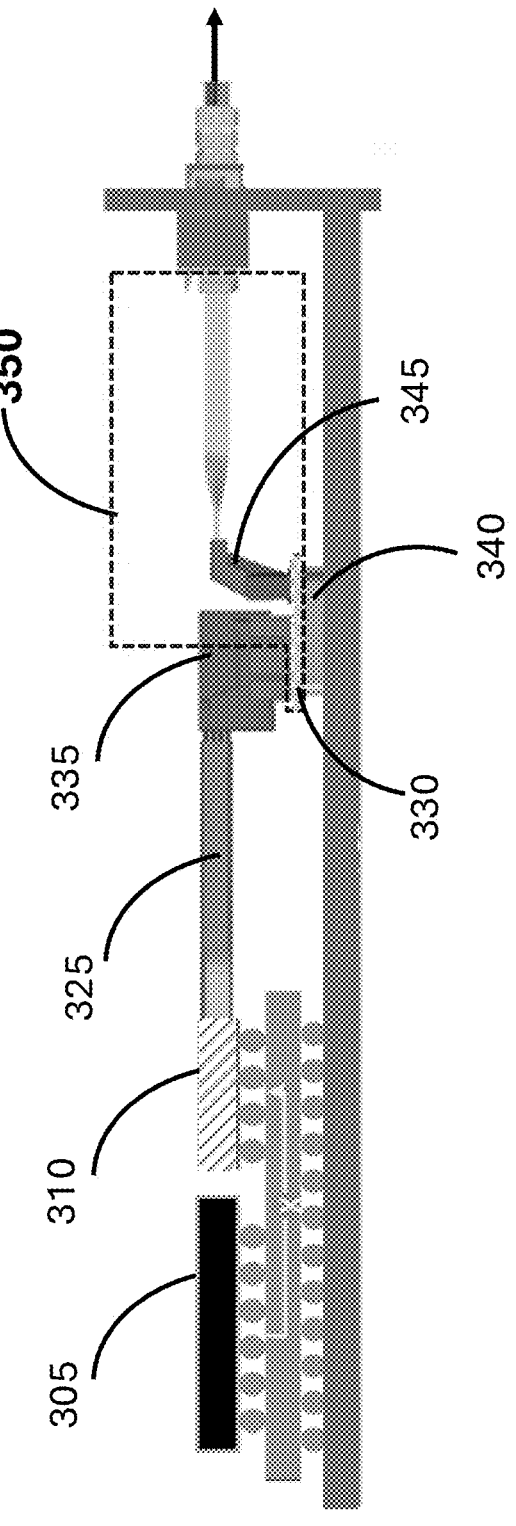
FIG. 3 illustrates an electrical-to-optical converter module according to some other embodiments of the present invention.

FIG. 3 illustrates an electrical-to-optical converter module according to some other embodiments, showing a few of the variations that may be possible without departing from the spirit of the present invention. One key difference between the arrangements shown in FIG. 2 and FIG. 3 is that electrical to optical converter module 350 and socket 335 (that terminates cable 325) simply plug mechanically into high speed substrate 330 to make the necessary mechanical and electrical connections rather than being soldered into place via BGAs or some other similar technique, in the case of electrical to optical converter module 250 and socket 235 in FIG. 2. Elements 305, 310, 325 and 345 in FIG. 3 correspond directly to elements 205, 210, 225, and 245 in FIG. 2.

In a practical application scenario, this may provide welcome flexibility, as the user or customer receives a system that includes all the elements shown in FIG. 3 in place, except that by default neither socket 335 nor electrical to optical (e-o) converter or converters 345 would be actually plugged in to make contact through high speed substrate 330 to DC socket layer 340, unless and until there is a need for high quality data transmission from ASIC 305 over a distance too great for a purely electrical connection to suffice. In the meantime, little to zero power would be drawn by high speed substrate layer 330 or the underlying DC socket layer 340, and there would be no adverse effects on signal transmission. However, when the need arises, electrical socket 335 and e-o converter 345 could each be plugged into substrate layer 330 in the arrangement shown in FIG. 3, with a potentially dramatic improvement in subsequent signal transmission. And if and when the need for that higher quality/longer distance transmission wanes, socket 335 and converter 345, and substrate 330 could simply be unplugged from socket layer 340.

For some of these "flexible" applications, the customer may be provided by the electrical to optical converter module supplier with a recommended PCB layout that allows the socket 335 (which would be supplied in these cases, already attached to the high speed substrate) and the electrical to optical module 345 (and optionally 330) to be conveniently plugged in only when desired, such that cable 330 could be plugged into socket 335 and substrate 330 would receive the high speed signal data from above and the necessary DC power and control signals from below. In other cases, the customer may provide the module supplier with information on their existing PCB layout and any other details necessary for interfacing the various components.

Figure 4:
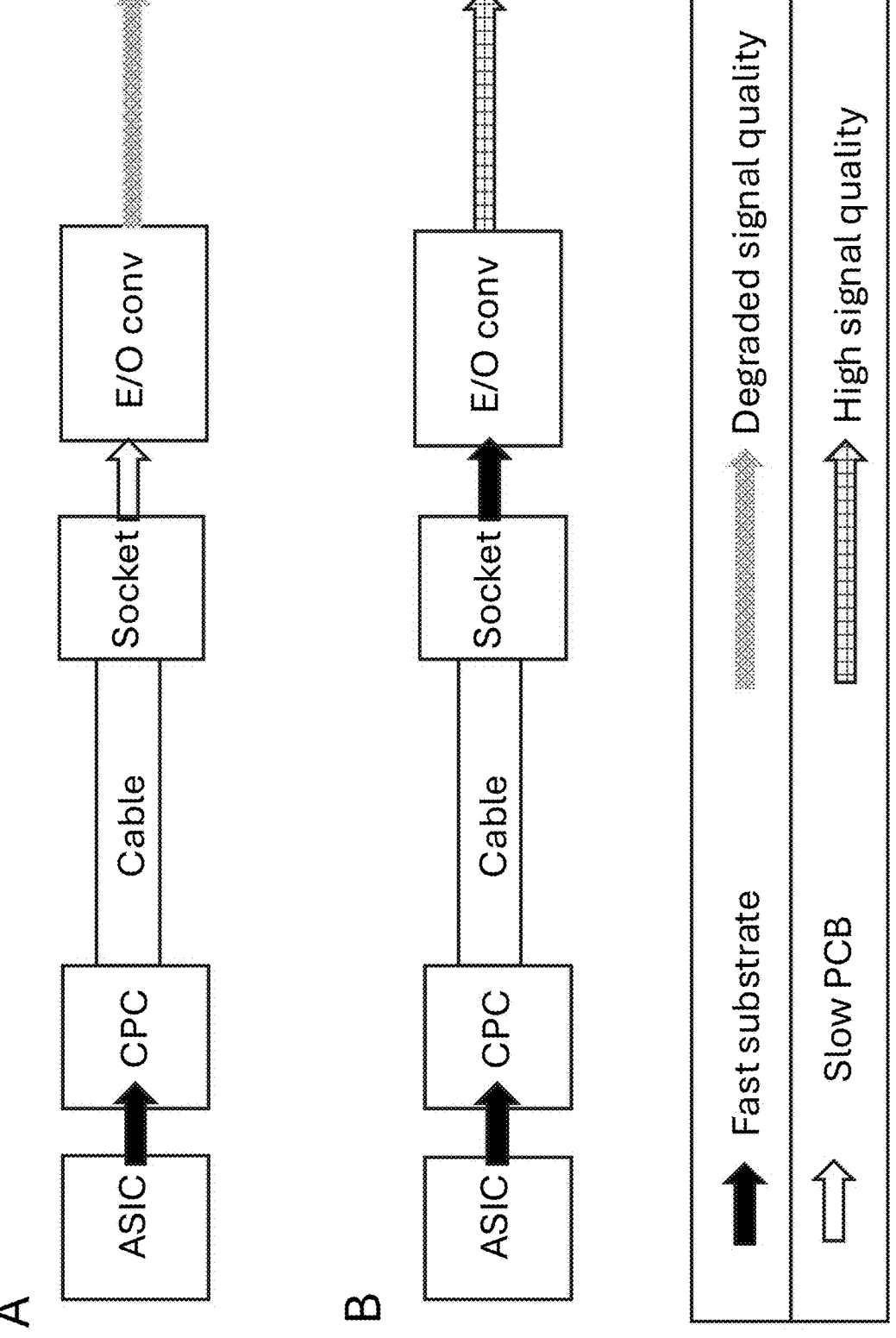
FIG. 4 illustrates differences between some prior art approaches and embodiments of the present invention.

Key differences between the prior art approach that involves electrical to optical conversion, as illustrated in example 150 of FIG. 1, and embodiments of the present invention as shown in FIGS. 2 and 3 may be summarized in terms of the data signal flow through components of the system. In prior art, the signals travel from a source chip into a copper cable by passing through a fast substrate, but are then forced to pass through slow PCB circuit paths before they are converted into optical data that can be sent over the remainder of the required transmission path along a fiberoptic cable. In embodiments of the present invention, the signals begin their passage in the same way, but then instead of a PCB they pass through another fast substrate to reach the components that perform the electrical to optical conversion. FIG. 4 presents a simplified block diagram view that illustrates these points, showing a representation (A) of the prior art in the top portion of the figure, a representation (B) of embodiments of the present invention in a central portion, and a key to the meaning of shading in those representations at the bottom of the figure.

Figure 5:
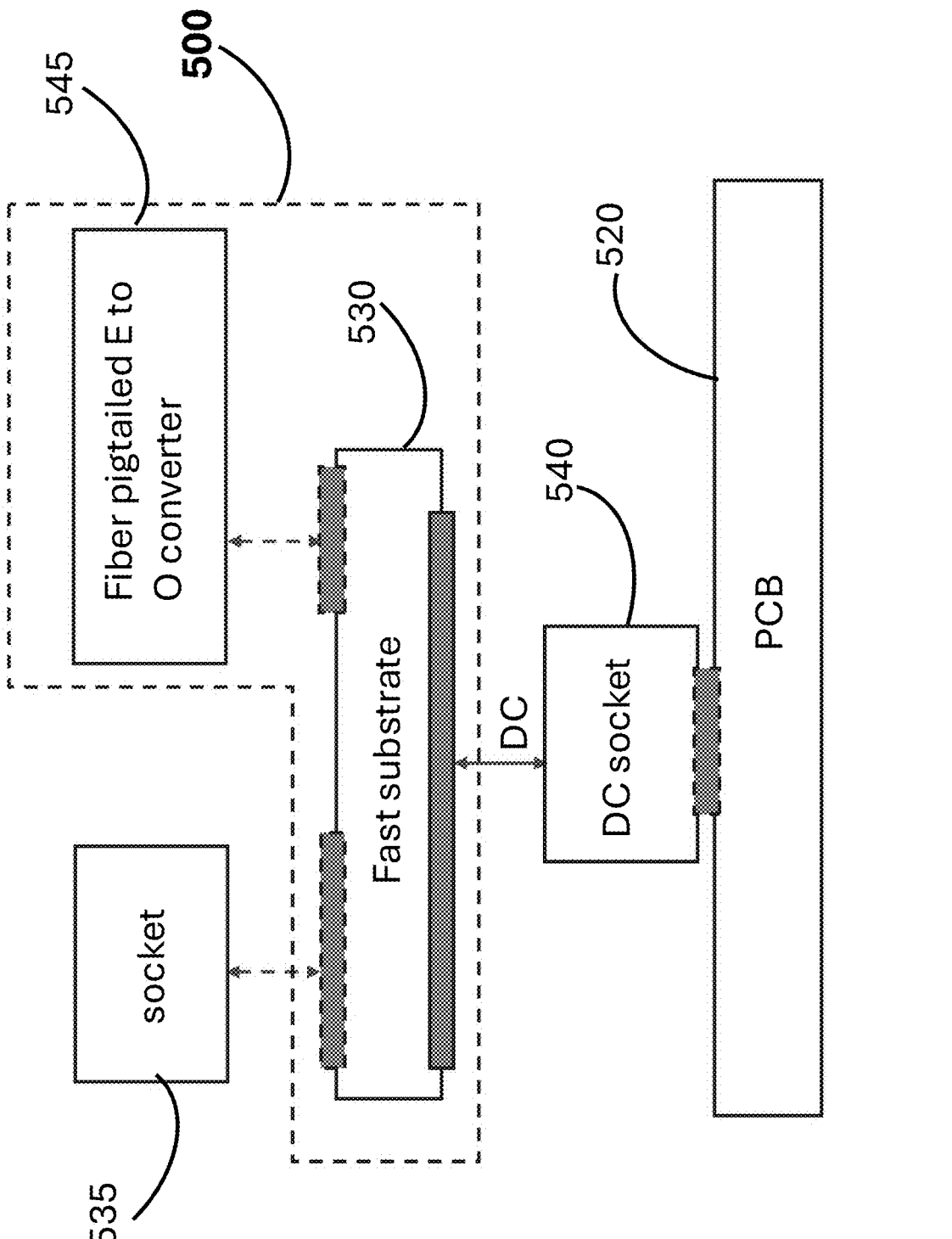
FIG. 5 is a block diagram representation of an electrical to optical converter module according to some embodiments of the present invention.

A block diagram view of an electrical to optical converter module 500 of the type described up to this point in the disclosure, is presented in FIG. 5, indicating the relationship of that module (comprising high speed substrate 530 and electrical to optical converter 545) to other components of the signal transmission system, in particular to cable attached socket 530, DC socket layer 540 and PCB 520. In all these embodiments discussed up to this point, the customer's preferred socket layer device would interface with the high speed substrate at the base of the module.

Figure 6:
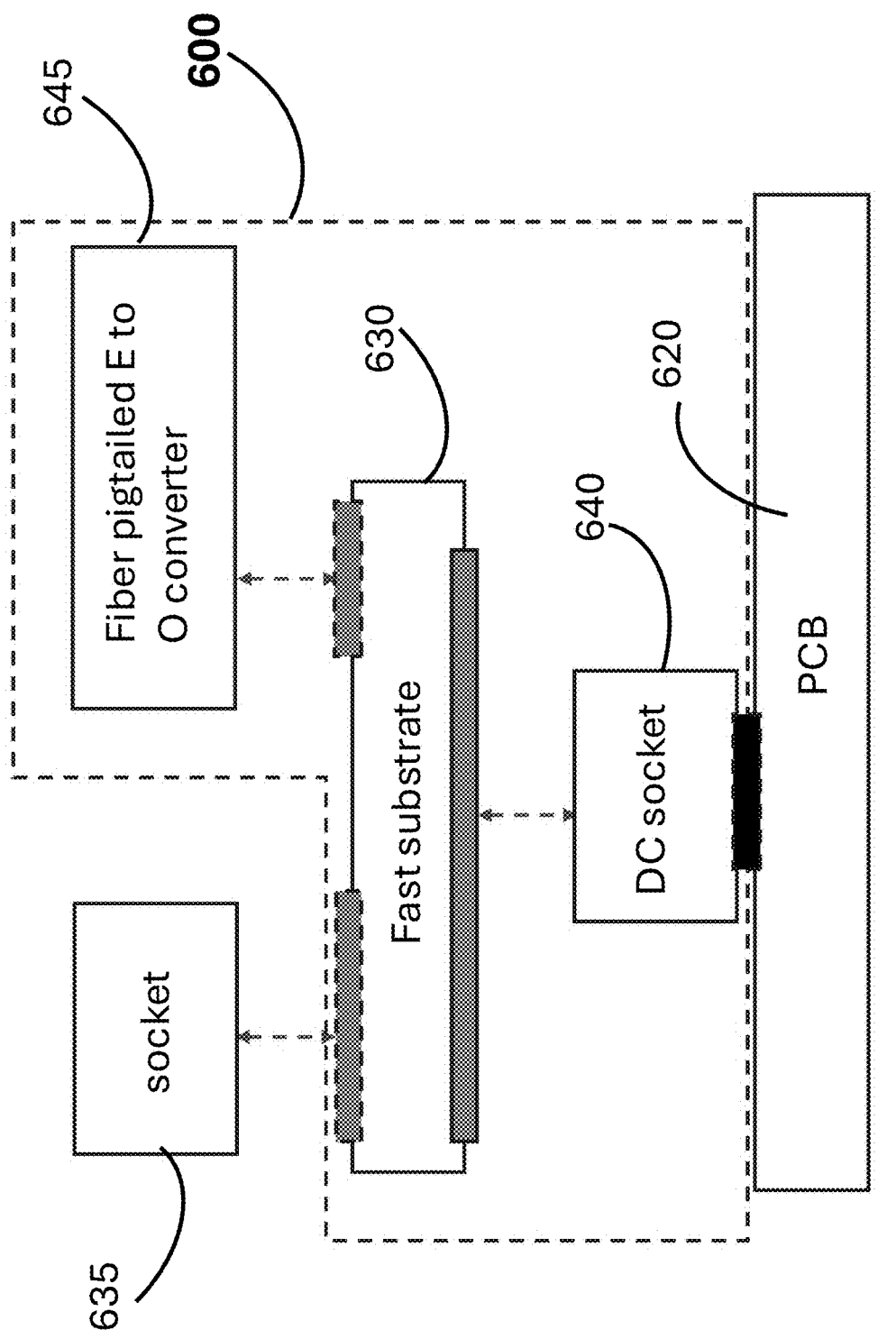
FIG. 6 is a block diagram representation of an electrical to optical converter module according to some other embodiments of the present invention.
Figure 7:
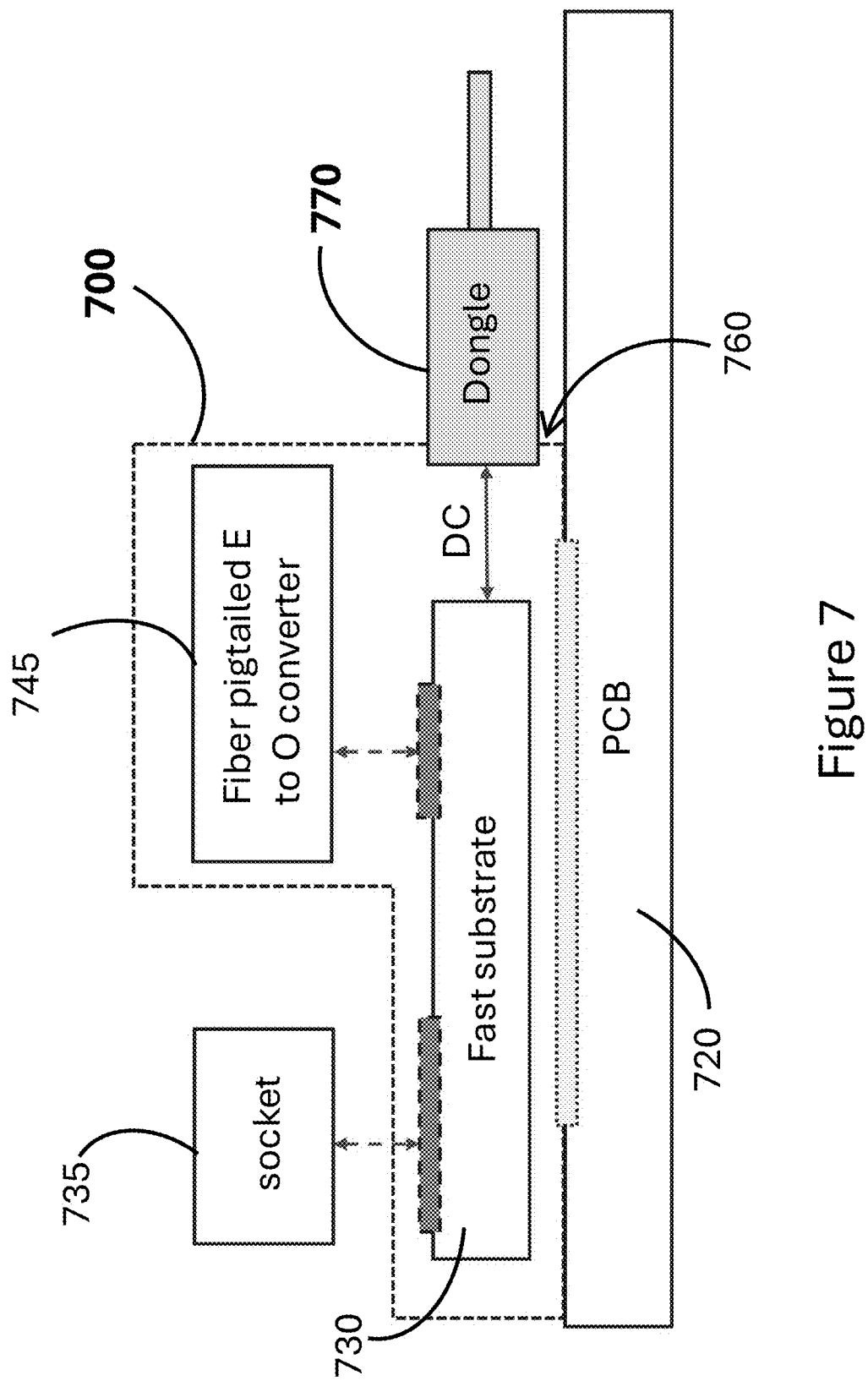
FIG. 7 is a block diagram representation of an electrical to optical converter module according to yet other embodiments of the present invention.

FIG. 6 presents a similar block diagram view to that of FIG. 5, but representing an electrical to optical converter module of a different type, according to other embodiments of the present invention. In these other embodiments, the electrical to optical converter module 600 offered to the customer would additionally provide the functionality of the socket layer discussed above, meaning it would not only include a high speed substrate 630, and one or more electrical to optical converters 645, (that may, as in all the other embodiments described in this disclosure) either be fiber pigtailed or fiber connectorized, meaning that each converter terminates in a connector to which a connectorized optical fiber can be attached) but also 640, an equivalent to the socket layer, providing DC power, grounding and control to that high speed substrate. Other components shown in this figure are the cable attached socket 635 and PCB 620 on which DC socket layer 640 is mounted. In some cases, other embodiments described, the electrical to optical converters may In yet other embodiments, the DC power, grounding and control functions of the socket layer (240 shown explicitly in FIG. 2 and implicitly as 340 in packaged form in FIG. 3) may be achieved in quite a different way, as illustrated in FIG. 7. In these other embodiments, an optical to electrical module 700, comprising a high speed substrate 730 and one or more e-o converters 745, would have a simple mechanical socket by which it could be attached to an underlying PCB 720, and would also have a DC socket port 760 into which a dongle 770 could be plugged. Dongle 770, powered via an attached electrical cable, would contain the necessary circuitry and components to provide DC socket-type functionality, and would be plugged into the module's DC socket 760 only if and when electrical to optical conversion is deemed to be desirable. At that same time, of course, the converter module 700 and socket 735 (delivering data signals from the source ASIC via a cable, unshown) would also have to be plugged into the high speed substrate of the module, as discussed above with respect to FIG. 3.

Figure 8:
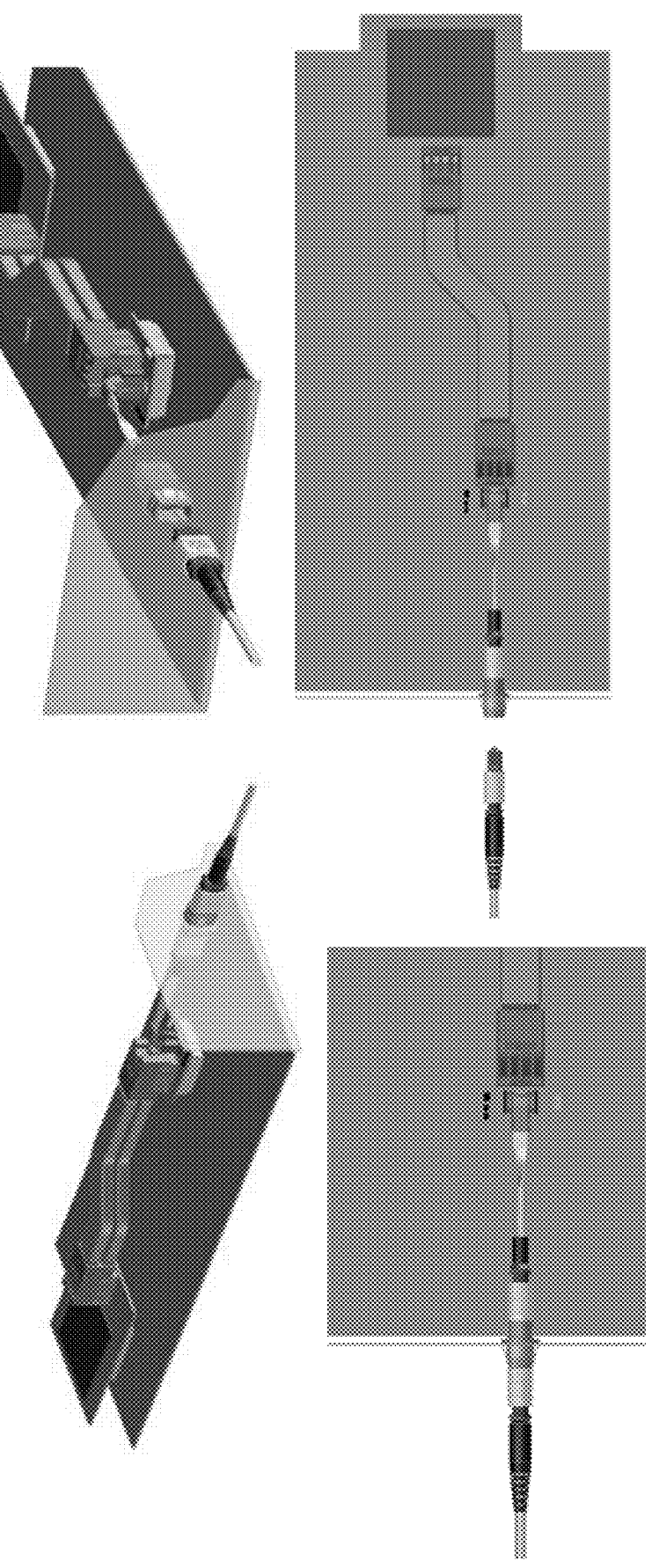
FIG. 8 illustrates perspective and top down views of components that may be used in some embodiments of the present invention.

Many other variations are possible without departing from the spirit of the present invention. FIGS. 8 and 9 show perspective, top down and angled lateral views of some of the components in a typical implementation of the invention, in which the CPC socket is co-packaged with the ASIC and the corresponding copper cable arches over the line card PCB onto the electrical to optical module, which is located mid-board between the ASIC and the faceplate.

In summary, the present invention improves the performance of high data rate chip to chip transmission systems in terms of distance and signal quality with a novel approach to achieving localized electrical to optical conversion that offers flexibility and convenience to the user.

It should be understood that the disclosure teaches just few examples of illustrative embodiments, that many variations of the invention can easily be devised by those skilled in the art after reading this disclosure, and that the scope of the present invention is to be determined by the following claims.

The invention claimed is:

1. An electrical to optical converter module comprising: one or more fiber pigtailed or fiber connectorized electrical to optical converters; and a module high speed substrate comprising one or more materials with characteristics enabling the module high speed substrate to carry electrical signals at data rates at or above 100 Gb/s; wherein the module high speed substrate is configured to deliver to the electrical to optical converters, for conversion to optical signals, electrical signals received from an output end of a copper cable via an electrical socket connected to the module high speed substrate, an input end of the copper cable being connected to a CPC socket mounted on a source high speed substrate, separate and distinct from the module high speed substrate; and connect to a DC socket module mounted on a PCB, wherein the module high speed substrate and the electrical socket are configured to incur signal losses lower than 1 dB/inch while carrying signals at data rates at or above 100 Gb/s.

2. The electrical to optical converter module of claim 1, wherein the module high speed substrate and the electrical socket are configured to incur signal losses no greater than 0.5 dB/inch while carrying signals at data rates at or above 100 Gb/s.

3. The electrical to optical converter module of claim 1, wherein the module high speed substrate comprises copper.

4. The electrical to optical converter module of claim 1, wherein the electrical socket is a co-packaged copper (CPC) socket.

5. An electrical to optical converter module comprising: one or more fiber pigtailed or fiber connectorized electrical to optical converters; a module high speed substrate comprising one or more materials with characteristics enabling the module high speed substrate to carry electrical signals at data rates at or above 100 Gb/s; and a DC socket layer; wherein the module high speed substrate is configured to deliver to the electrical to optical converters, for conversion to optical signals, electrical signals received from an output end of a copper cable via an electrical socket connected to the module high speed substrate, an input end of the copper cable being connected to a CPC socket mounted on a source high speed substrate separate and distinct from the module high speed substrate; wherein the module high speed substrate and the electrical socket are configured to incur signal losses no greater than 0.5 dB/inch while carrying signals at data rates at or above 100 Gb/s.

6. The electrical to optical converter module of claim 5, wherein the module high speed substrate comprises copper.

7. The electrical to optical converter module of claim 5, wherein the DC socket layer is configured to provide DC power, ground and control signals to the module high speed substrate.

8. An electrical to optical converter module comprising: one or more fiber pigtailed or fiber connectorized electrical to optical converters; and a module high speed substrate comprising one or more materials with characteristics enabling the module high speed substrate to carry electrical signals at data rates at or above 100 Gb/s; wherein the module high speed substrate is configured to connect to the one or more fiber pigtailed or fiber connectorized electrical to optical converters; an electrical socket configured to carry signals at data rates at or above 100 Gb/s; and a dongle comprising circuitry configured to provide DC power, ground and control signals to the substrate to the substrate; wherein the module high speed substrate and the electrical socket are configured to incur signal losses no greater than 0.5 dB/inch while carrying signals at data rates at or above 100 Gb/s.

9. The electrical to optical converter module of claim 8, wherein the module high speed substrate comprises copper.

* * * * *